United States Patent
Ibaragi et al.

(10) Patent No.: US 11,309,864 B2
(45) Date of Patent: Apr. 19, 2022

(54) PIEZOELECTRIC RESONATOR UNIT AND METHOD FOR MANUFACTURING THE PIEZOELECTRIC RESONATOR UNIT

(71) Applicant: Murata Manufacturing Co., Ltd., Nagaokakyo (JP)

(72) Inventors: Hiroshi Ibaragi, Nagaokakyo (JP); Ryuichi Kawai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 170 days.

(21) Appl. No.: 16/807,403

(22) Filed: Mar. 3, 2020

(65) Prior Publication Data
US 2020/0220519 A1    Jul. 9, 2020

Related U.S. Application Data

(63) Continuation of application No. PCT/JP2018/034999, filed on Sep. 21, 2018.

(30) Foreign Application Priority Data

Sep. 22, 2017  (JP) .............................. JP2017-182818

(51) Int. Cl.
*H03H 9/10*  (2006.01)
*H03H 3/02*  (2006.01)
(Continued)

(52) U.S. Cl.
CPC ............ *H03H 9/1021* (2013.01); *H03H 3/02* (2013.01); *H03H 9/02102* (2013.01);
(Continued)

(58) Field of Classification Search
CPC ............ H03H 9/1021; H03H 9/02102; H03H 9/02133; H03H 9/0509; H03H 9/19;
(Continued)

(56) References Cited

U.S. PATENT DOCUMENTS

2012/0174360 A1\*  7/2012  Sato ....................... H03H 9/105
                                                                29/25.35
2014/0043779 A1     2/2014  Nakayama

FOREIGN PATENT DOCUMENTS

JP    2000058687 A    2/2000
JP    2002050710 A    2/2002
(Continued)

OTHER PUBLICATIONS

International Search Report issued for PCT/JP2018/034999, dated Nov. 6, 2018.
(Continued)

*Primary Examiner* — Jeffrey M Shin
(74) *Attorney, Agent, or Firm* — ArentFox Schiff LLP

(57) ABSTRACT

A quartz crystal resonator unit that includes a quartz crystal resonator, a lid member and a base member defining an internal space that accommodates the quartz crystal resonator, and a sealing frame and a joining material joining the lid member and the base member to each other. In a plan view of a principal surface of the base member, the sealing frame and the joining material have a frame shape surrounding the quartz crystal resonator, and the frame shape has a uniform width.

20 Claims, 14 Drawing Sheets

(51) Int. Cl.
    *H03H 9/02* (2006.01)
    *H03H 9/05* (2006.01)
    *H03H 9/19* (2006.01)
(52) U.S. Cl.
    CPC ...... *H03H 9/02133* (2013.01); *H03H 9/0509* (2013.01); *H03H 9/19* (2013.01); *H03H 2003/022* (2013.01)
(58) Field of Classification Search
    CPC .. H03H 9/0519; H03H 3/02; H03H 2003/022; H01L 23/02
    See application file for complete search history.

(56) References Cited

FOREIGN PATENT DOCUMENTS

| | | |
|---|---|---|
| JP | 2014036081 A | 2/2014 |
| JP | 2014049562 A | 3/2014 |
| JP | 2016031949 A | 3/2016 |
| JP | 2017011045 A | 1/2017 |

OTHER PUBLICATIONS

Written Opinion of the International Searching Authority issued for PCT/JP2018/034999, dated Nov. 6, 2018.

* cited by examiner

PIEZOELECTRIC RESONATOR UNIT AND METHOD FOR MANUFACTURING THE PIEZOELECTRIC RESONATOR UNIT

CROSS REFERENCE TO RELATED APPLICATIONS

The present application is a continuation of International application No. PCT/JP2018/034999, filed Sep. 21, 2018, which claims priority to Japanese Patent Application No. 2017-182818, filed Sep. 22, 2017, the entire contents of each of which are incorporated herein by reference.

FIELD OF THE INVENTION

The present invention relates to a piezoelectric resonator unit and a method for manufacturing the piezoelectric resonator unit.

BACKGROUND OF THE INVENTION

Generally, a quartz crystal resonator unit is known as a piezoelectric resonator unit. The quartz crystal resonator unit includes, for example, a quartz crystal resonator, a lid member and a base member forming a housing that accommodates the quartz crystal resonator therein, and a joining member configured to join the lid member and the base member. The joining member seals the internal space of the lid member and the base member for accommodating the quartz crystal resonator.

Dimensional variation in the joining member creates voids or leads to stress concentration caused by thermal expansion or contraction during processing. As a result, for example, damage (or cracks) originating at the voids in the joining material may negatively affect the hermeticity of the lid member and the base member.

Patent Document 1 discloses an electronic-device accommodating package that includes a substrate having a recess in an upper surface thereof for accommodating an electronic device, and a window plate having a polygonal principal surface and joined to a region around the recess to hermetically seal the recess. The window plate of the electronic-device accommodating package has a metal layer on an outer region of the principal surface. The metal layer has, at each corner thereof, a thin portion that is smaller in thickness.

Patent Document 1: Japanese Unexamined Patent Application Publication No. 2014-049562

SUMMARY OF THE INVENTION

In the electronic-device accommodating package disclosed in Patent Document 1, where the metal layer of the window plate has a thin portion at each corner thereof, the amount of window joining material may be insufficient. This may negatively affect the hermeticity of the electronic-device accommodating package disclosed in Patent Document 1, and may lead to increased hermeticity defects.

The present invention has been made in view of the circumstances described above. An object of the present invention is to provide a piezoelectric resonator unit that can reduce loss of hermeticity of a lid member and a base member, and a method for manufacturing the piezoelectric resonator unit.

A piezoelectric resonator unit according to an aspect of the present invention includes a piezoelectric resonator, a lid member and a base member defining an internal space that accommodates the piezoelectric resonator, and a joining member joining the lid member and the base member. In a plan view of a principal surface of the base member, the joining member has a frame shape with a uniform width dimension surrounding the piezoelectric resonator.

A piezoelectric resonator unit manufacturing method according to another aspect of the present invention includes preparing a base member, holding a piezoelectric resonator on a principal surface of the base member, and joining a lid member to the base member with a joining member. In a plan view of the principal surface of the base member, the joining member has a frame shape surrounding the piezoelectric resonator, and the frame shape has a uniform width.

The present invention can reduce loss of hermeticity of the lid member and the base member.

DETAILED DESCRIPTION OF THE PREFERRED EMBODIMENTS

Figure 1:
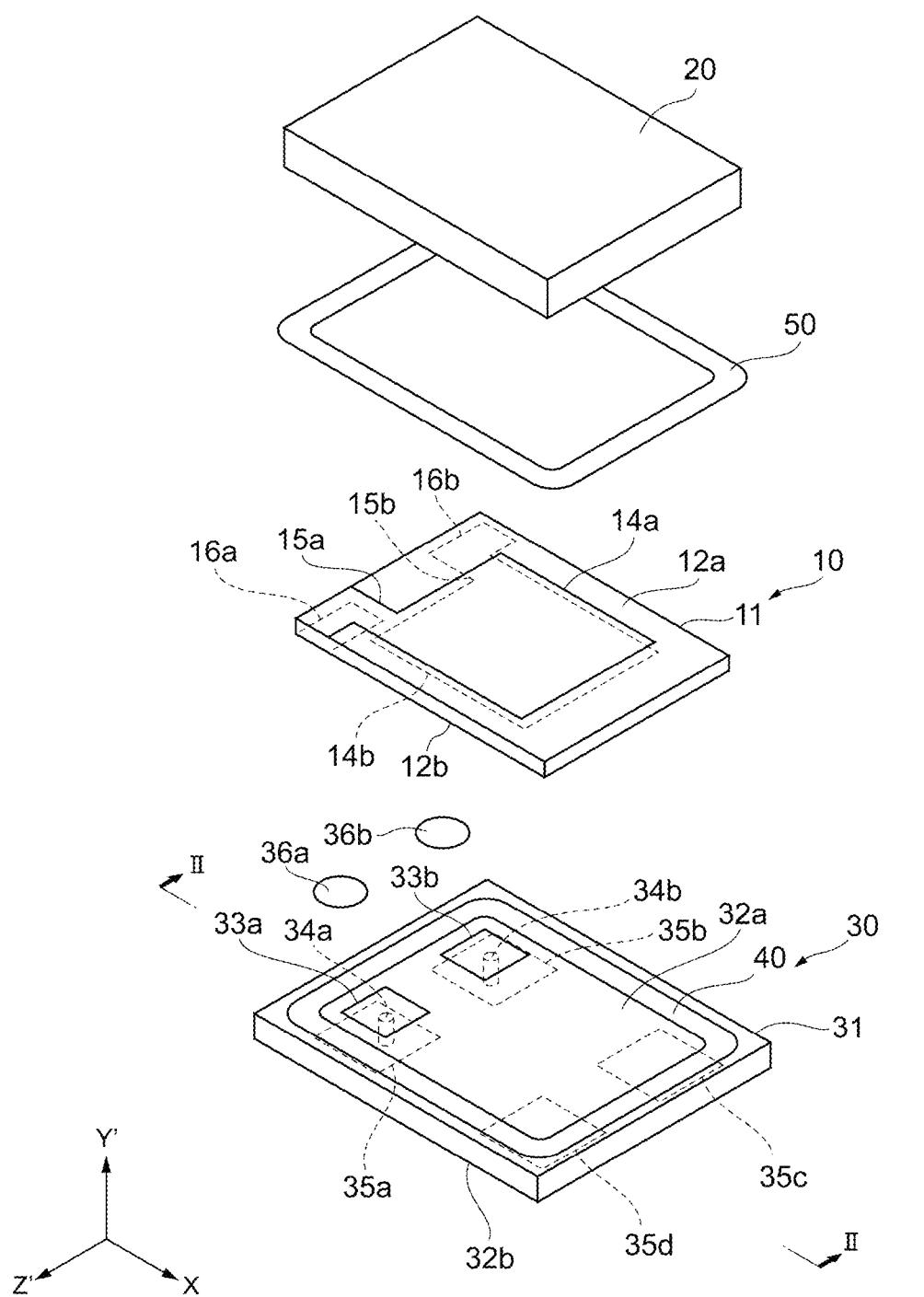
FIG. 1 is an exploded perspective view of a quartz crystal resonator unit according to a first embodiment of the present invention.

Embodiments of the present invention will now be described. In the following description of the drawings, the same or similar components are denoted by the same or similar reference numerals. Note that the drawings are provided for illustrative purposes, and dimensions and shapes of parts are schematically shown. The technical scope of the present invention should not be interpreted as being limited to the embodiments described herein.

In the following description, a quartz crystal resonator unit including a quartz crystal resonator will be described as an exemplary piezoelectric resonator unit. The quartz crystal resonator uses a quartz crystal element as a piezoelectric body that vibrates in response to an applied voltage. Note that the piezoelectric resonator unit according to any of the embodiments of the present invention is not limited to the quartz crystal resonator unit, and may be one that uses a different piezoelectric body, such as a ceramic body.

<First Embodiment>

Figure 2:
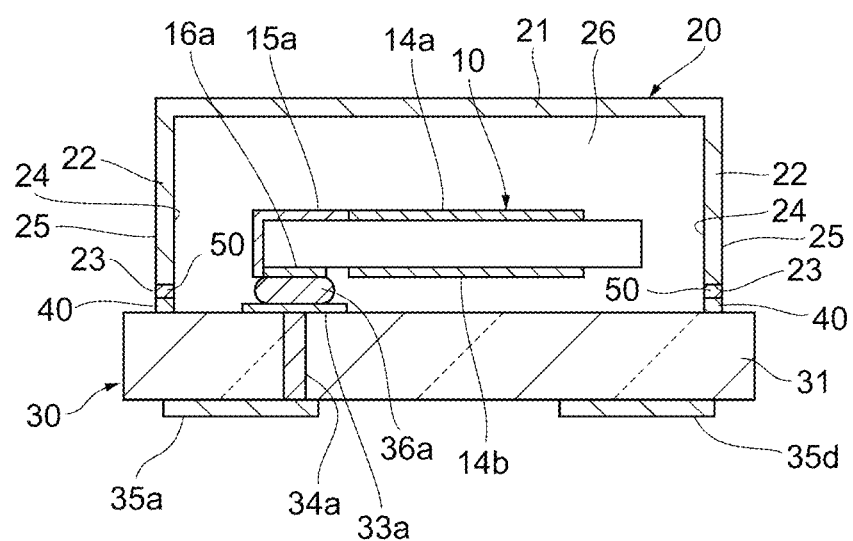
FIG. 2 is a cross-sectional view taken along line II-II in FIG. 1.
Figure 3:
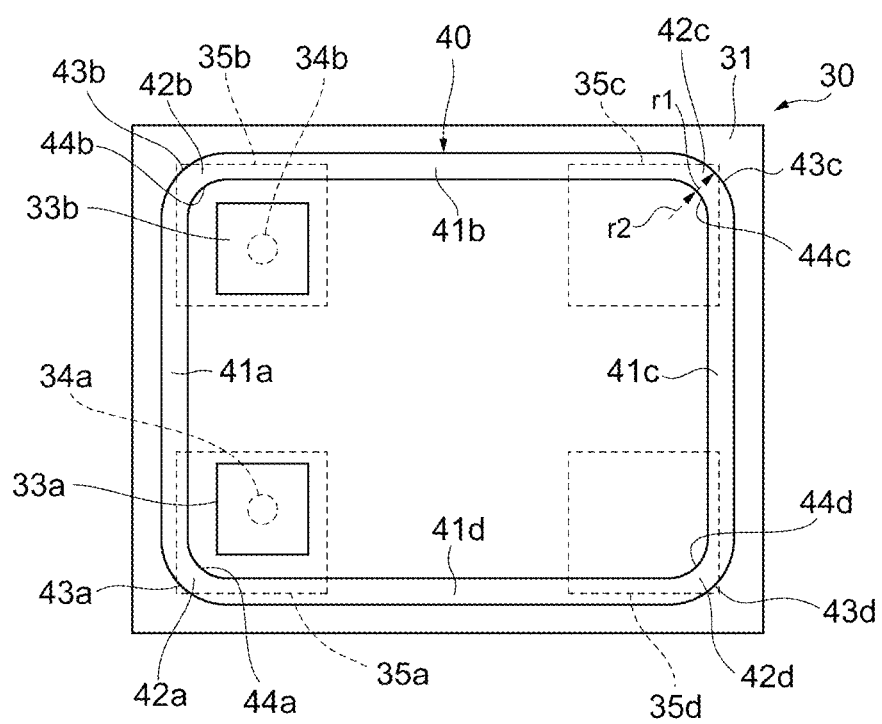
FIG. 3 is a plan view of a base member illustrated in FIG. 1.
Figure 4:
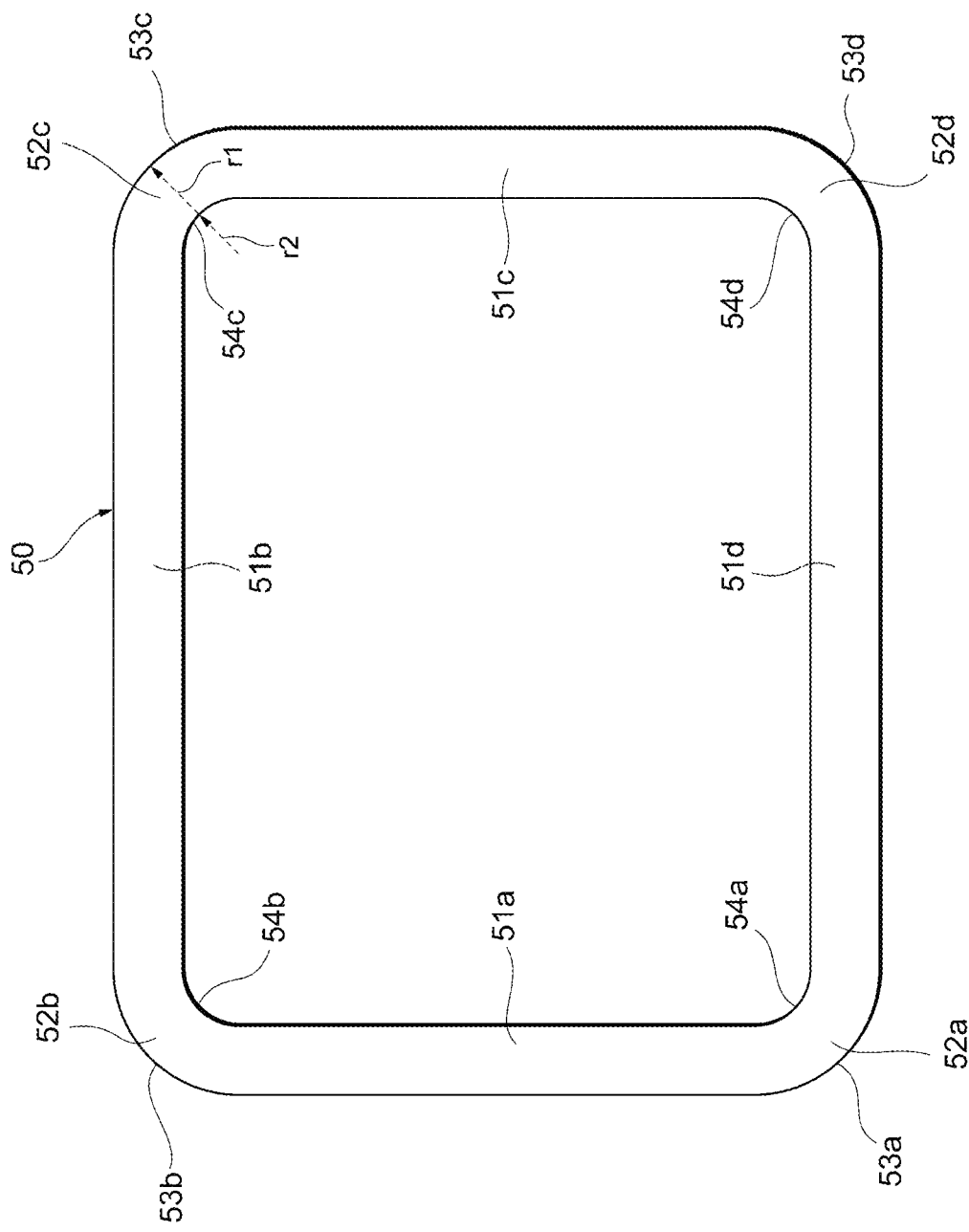
FIG. 4 is a plan view of a joining material illustrated in FIG. 1.
Figure 5:
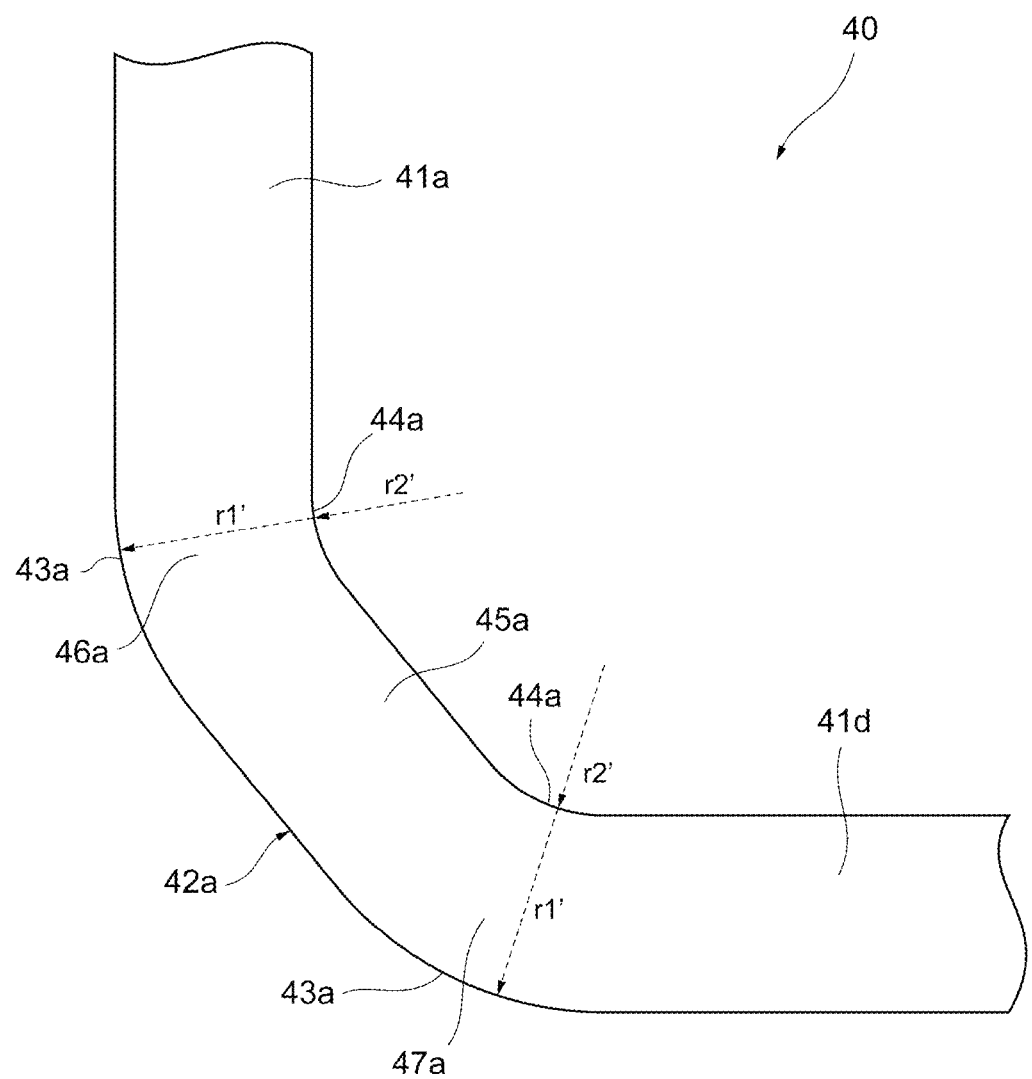
FIG. 5 is an enlarged view of a main part of an exemplary modification of a sealing frame illustrated in FIG. 3.
Figure 6:
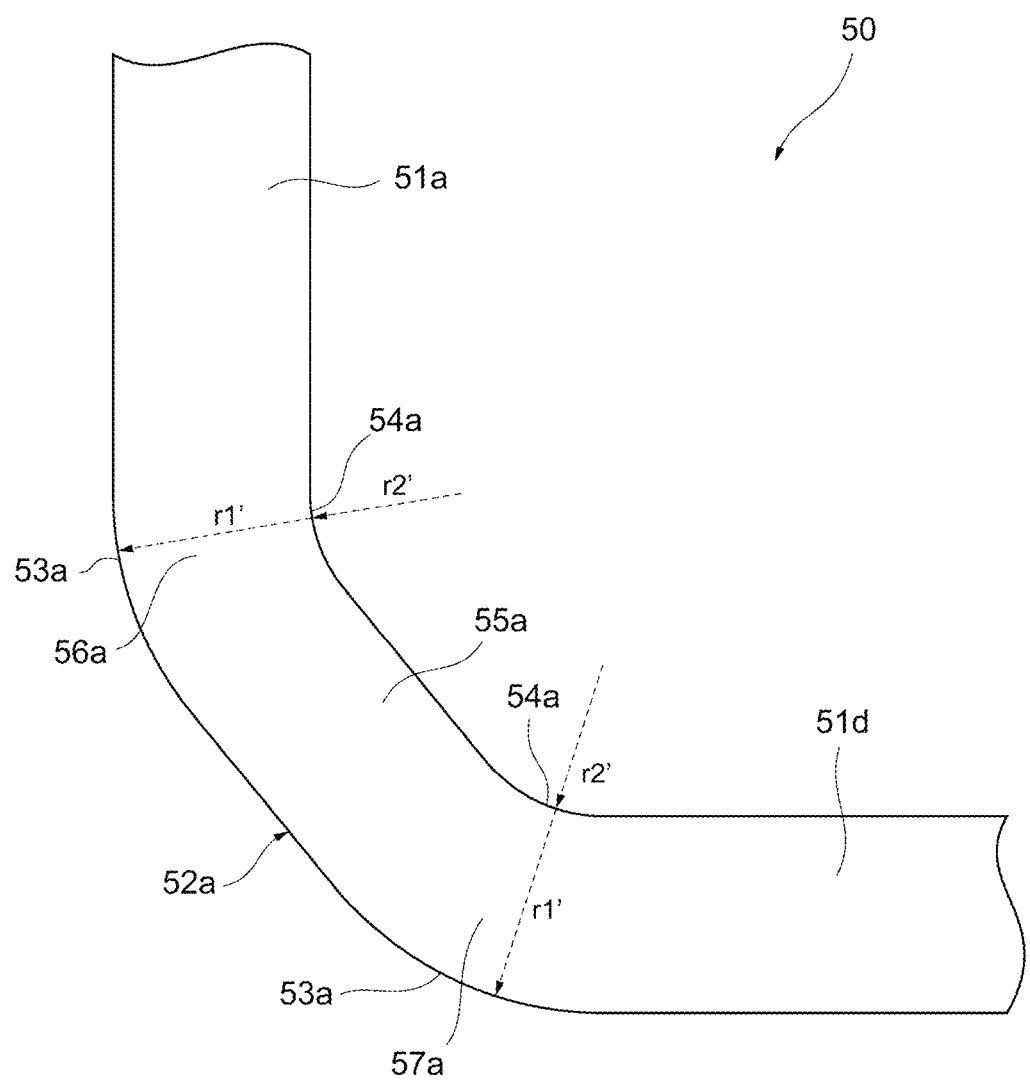
FIG. 6 is an enlarged view of a main part of an exemplary modification of the joining material illustrated in FIG. 4.

A quartz crystal resonator unit according to a first embodiment of the present invention will now be described with reference to FIG. 1 to FIG. 6. FIG. 1 is an exploded perspective view of the quartz crystal resonator unit according to the first embodiment of the present invention. FIG. 2 is a cross-sectional view taken along line II-II in FIG. 1. FIG. 3 is a plan view of a base member illustrated in FIG. 1. FIG. 4 is a plan view of a joining material illustrated in FIG. 1. FIG. 5 is an enlarged view of a main part of an exemplary modification of a sealing frame illustrated in FIG. 3. FIG. 6 is an enlarged view of a main part of an exemplary modification of the joining material illustrated in FIG. 4.

As illustrated in FIG. 1, a quartz crystal resonator unit 1 according to the present embodiment includes a quartz crystal resonator 10, a lid member 20, and a base member 30. The lid member 20 and the base member 30 serve as part of a retainer structure for accommodating the quartz crystal resonator 10.

The quartz crystal resonator 10 includes an AT-cut quartz crystal element 11. The X-axis, the Y-axis, and the Z-axis are crystallographic axes of a quartz crystal. Axes obtained by rotating the Y-axis and the Z-axis by 35°15'±1'30" about the X-axis in the direction from the Y-axis to the Z-axis are defined as the Y'-axis and the Z'-axis, respectively. The AT-cut quartz crystal element 11 is cut out, with its surfaces lying in planes parallel to the plane defined by the X-axis and the Z'-axis being its principal surfaces. Hereinafter, a plane parallel to the plane defined by the X-axis and the Z'-axis will be referred to as "XZ'-plane". The same applies to planes defined by other axes. The quartz crystal element 11 has a first principal surface 12a and a second principal surface 12b that lie in XZ'-planes opposite each other.

The quartz crystal element 11, which is an AT-cut quartz crystal element, has a long-side direction in which long sides thereof parallel to the X-axis direction extend, a short-side direction in which short sides thereof parallel to the Z'-axis direction extend, and a thickness direction in which a thickness thereof parallel to the Y'-axis direction extends. The quartz crystal element 11 is rectangular in the XZ'-plane.

Quartz crystal resonators using an AT-cut quartz crystal element have high frequency stability over a wide range of temperatures. Also, the AT-cut quartz crystal resonators have good aging characteristics, and can be readily manufactured. The AT-cut quartz crystal resonators use a thickness shear vibration mode as a principal mode of vibration.

In the present embodiment, the quartz crystal element 11 has a flat plate-like shape. Both the first principal surface 12a and the second principal surface 12b of the quartz crystal element 11 are flat.

The quartz crystal resonator 10 includes a first excitation electrode 14a and a second excitation electrode 14b forming a set of electrodes. The first excitation electrode 14a is disposed on the first principal surface 12a, and the second excitation electrode 14b is disposed on the second principal surface 12b. The first excitation electrode 14a and the second excitation electrode 14b are disposed opposite each other, with the quartz crystal element 11 interposed therebetween, in a region including the respective centers of the principal surfaces. The first excitation electrode 14a and the second excitation electrode 14b are disposed to substantially entirely overlap in plan view of the XZ'-plane.

The first excitation electrode 14a and the second excitation electrode 14b each have long sides parallel to the X-axis direction, short sides parallel to the Z'-axis direction, and a thickness parallel to the Y'-axis direction. In the example illustrated in FIG. 1, in the XZ'-plane, the long sides of the first and second excitation electrodes 14a and 14b are parallel to the long sides of the quartz crystal element 11. Similarly, the short sides of the first and second excitation electrodes 14a and 14b are parallel to the short sides of the quartz crystal element 11. The long sides of the first and second excitation electrodes 14a and 14b are spaced from the corresponding long sides of the quartz crystal element 11. Similarly, the short sides of the first and second excitation electrodes 14a and 14b are spaced from the corresponding short sides of the quartz crystal element 11.

The quartz crystal resonator 10 includes extended electrodes 15a and 15b and connection electrodes 16a and 16b. The connection electrode 16a is electrically connected by the extended electrode 15a to the first excitation electrode 14a. The connection electrode 16b is electrically connected by the extended electrode 15b to the second excitation electrode 14b. The connection electrodes 16a and 16b are terminals for electrical connection to the base member 30. The connection electrodes 16a and 16b are both disposed on the second principal surface 12b of the quartz crystal element 11. In the vicinity of the short side of the quartz crystal element 11 on the negative side of the X-axis, the connection electrodes 16a and 16b are arranged along the short-side direction.

The extended electrode 15a electrically connects the first excitation electrode 14a to the connection electrode 16a. Specifically, on the first principal surface 12a, the extended electrode 15a extends from the first excitation electrode 14a toward the negative side of the Z'-axis and the negative side of the X-axis, further extends from the first principal surface 12a across the side face of the quartz crystal element 11 to reach the second principal surface 12b, and electrically connects to the connection electrode 16a on the second principal surface 12b. The extended electrode 15b electrically connects the second excitation electrode 14b to the connection electrode 16b. Specifically, on the second principal surface 12b, the extended electrode 15b extends from the second excitation electrode 14b toward the negative side of the X-axis and electrically connects to the connection electrode 16b on the second principal surface 12b. By extending the extended electrodes 15a and 15b in this manner, the connection electrodes 16a and 16b electrically connected to the first and second excitation electrodes 14a and 14b disposed on the first and second principal surfaces 12a and 12b, respectively, can both be arranged on the second principal surface 12b.

The connection electrodes 16a and 16b are electrically connected by conductive retaining members 36a and 36b, respectively, to corresponding electrodes of the base member 30. The conductive retaining members 36a and 36b are formed by thermally hardening a conductive adhesive.

Materials used to form the first and second excitation electrodes 14a and 14b, the extended electrodes 15a and 15b, and the connection electrodes 16a and 16b are not limited to specific ones. For example, these electrodes may each have a chromium (Cr) layer as a base layer, and also have a gold (Au) layer on the surface of the chromium layer.

Although the quartz crystal resonator 10 described in the present embodiment includes the quartz crystal element 11 having a flat plate-like shape, the configuration is not limited to this. The quartz crystal element may have a mesa structure where the vibrating portion including the center of the principal surface is thicker than the outer edge, or may have an inverted mesa structure where the vibrating portion is thinner than the outer edge. The quartz crystal element may have a convex or beveled shape where its thickness continuously changes from the vibrating portion toward the outer edge. The quartz crystal element may have, for example, a BT-cut angle, not the AT-cut angle. The quartz crystal resonator may be a tuning-fork quartz crystal resonator using a quartz crystal plate as a base material. The quartz crystal plate is cut out at a predetermined angle relative to the X-axis, the Y-axis, and the Z-axis which are crystallographic axes of a quartz crystal orthogonal to each other. The tuning-fork quartz crystal resonator includes a quartz crystal element including a base and at least one vibration arm extending from the base, and an excitation electrode disposed on the vibration arm for bending vibration.

The lid member 20 and the base member 30 are for accommodating the quartz crystal resonator 10. The lid member 20 and the base member 30 define an internal space 26 that accommodates the quartz crystal resonator 10. The lid member 20 and the base member 30 are joined by a sealing frame 40 and a joining material 50 described below.

Note that the sealing frame 40 and the joining material 50 according to the present embodiment correspond to an example of "joining member" of the present invention.

The lid member 20 has a tray-like shape or, more specifically, a box shape with an opening, and has an inner surface 24 and an outer surface 25. The lid member 20 includes a top portion 21 facing a first principal surface 32a of the base member 30, and a side wall portion 22 connected to the outer edge of the top portion 21 and extending in a direction normal to the principal surface of the top portion 21. The lid member 20 has a long-side direction in which long sides thereof parallel to the X-axis direction extend, a short-side direction in which short sides thereof parallel to the Z'-axis direction extend, and a height direction parallel to the Y'-axis direction. The lid member 20 has, at the opening edge of the tray-like shape, a counter face 23 facing the first principal surface 32a of the base member 30. The counter face 23 has a frame shape and extends around the quartz crystal resonator 10.

For example, the lid member 20 is made of metal. Specifically, the lid member 20 is made of an alloy (e.g., 42 alloy) containing iron (Fe) and nickel (Ni). The innermost surface (including the inner surface 24) of the lid member 20 may be plated with, for example, nickel (Ni). Also, the outermost surface (including the outer surface 25) of the lid member 20 may be coated with, for example, a gold (Au) layer for protection against oxidation. Additionally, the counter face 23 of the lid member 20 may be plated with, for example, nickel (Ni) and gold (Au). Note that the material used to form the lid member 20 is not limited to a specific one.

The base member 30 is configured to support the quartz crystal resonator 10 in such a manner that the quartz crystal resonator 10 can be excited. Specifically, the quartz crystal resonator 10 is retained on the first principal surface 32a of the base member 30, with the conductive retaining members 36a and 36b interposed therebetween, in such a manner that the quartz crystal resonator 10 can be excited.

The base member 30 has a flat plate-like shape. The base member 30 has a long-side direction in which long sides thereof parallel to the X-axis direction extend, a short-side direction in which short sides thereof parallel to the Z'-axis direction extend, and a thickness direction in which a thickness thereof parallel to the Y'-axis direction extends.

The base member 30 includes a substrate 31. The substrate 31 has the first principal surface 32a and a second principal surface 32b that lie in XZ'-planes opposite each other. The substrate 31 is, for example, a sintered insulating ceramic (alumina) member. In this case, the substrate 31 may be formed by stacking a plurality of insulating ceramic sheets and sintering them. Alternatively, the substrate 31 may be made of a glass material (e.g., silicate glass, or material primarily composed of non-silicate materials and exhibiting a glass transition phenomenon when temperature rises), a quartz crystal material (e.g., AT-cut quartz crystal), or glass epoxy resin. The substrate 31 is preferably made of a heat-resistant material. The substrate 31 may be formed by a single layer or multiple layers. When the substrate 31 is formed by multiple layers, the substrate 31 includes an insulating layer formed as the outermost layer having the first principal surface 32a.

The base member 30 includes electrode pads 33a and 33b disposed on the first principal surface 32a, and outer electrodes 35a, 35b, 35c, and 35d disposed on the second principal surface 32b. The electrode pads 33a and 33b are terminals for electrical connection to the quartz crystal resonator 10. The outer electrodes 35a, 35b, 35c, and 35d are terminals for electrical connection to a circuit board (not shown). The electrode pad 33a is electrically connected to the outer electrode 35a by a via electrode 34a extending in the Y'-axis direction, and the electrode pad 33b is electrically connected to the outer electrode 35b by a via electrode 34b extending in the Y'-axis direction. The via electrodes 34a and 34b are formed in respective via holes (not shown) passing through the substrate 31 in the Y'-axis direction.

On the first principal surface 32a, the electrode pads 33a and 33b are disposed near the short side of the base member 30 on the negative side of the X-axis. In the example illustrated in FIG. 1, the electrode pads 33a and 33b are spaced from the short side of the base member 30 and arranged along the short-side direction. The electrode pad 33a is connected to the connection electrode 16a of the quartz crystal resonator 10, with the conductive retaining member 36a interposed therebetween. The electrode pad 33b is connected to the connection electrode 16b of the quartz crystal resonator 10, with the conductive retaining member 36b interposed therebetween.

The outer electrodes 35a, 35b, 35c, and 35d are disposed near the respective corners of the second principal surface 32b. In the example illustrated in FIG. 1, the outer electrodes 35a and 35b are disposed directly below the electrode pads 33a and 33b, respectively. This allows the via electrodes 34a and 34b extending in the Y'-axis direction to electrically connect the outer electrodes 35a and 35b to the electrode pads 33a and 33b, respectively.

Of the four outer electrodes 35a to 35d, in the example illustrated in FIG. 1, the outer electrodes 35a and 35b disposed near the short side of the base member 30 on the negative side of the X-axis are input and output electrodes to which input and output signals of the quartz crystal resonator 10 are supplied. The outer electrodes 35c and 35d disposed near the short side of the base member 30 on the positive side of the X-axis are dummy electrodes to which input and output signals of the quartz crystal resonator 10 are not supplied.

The sealing frame 40 (described below) is disposed on the first principal surface 32a of the substrate 31. The lid member 20 and the base member 30 are joined by the sealing frame 40 and the joining material 50 (described below).

The electrode pads 33a and 33b and the outer electrodes 35a to 35d of the base member 30 are formed of metal films. For example, the electrode pads 33a and 33b and the outer electrodes 35a to 35d are formed by stacking a molybdenum (Mo) layer, a nickel (Ni) layer, and a gold (Au) layer in this order from the bottom to the top.

The arrangement of the electrode pads 33a and 33b and the outer electrodes 35a to 35d is not limited to the example described above. For example, the electrode pad 33a may be disposed near one short side of the base member 30, and the electrode pad 33b may be disposed near the other short side of the base member 30. With this configuration, the quartz crystal resonator 10 is held by the base member 30 at both end portions of the quartz crystal element 11 in the long-side direction.

The arrangement of the outer electrodes is not limited to the example described above. For example, two outer electrodes serving as input and output electrodes may be diagonally arranged on the second principal surface 32b. Four outer electrodes may each be disposed near the center of the corresponding side of the second principal surface 32b, rather than at the corresponding corner of the second principal surface 32b. The number of outer electrodes is not limited to four. For example, only two outer electrodes serving as input and output electrodes may be provided.

Also, the electrical connection between the electrode pads and the outer electrodes is not limited to that made by the via electrodes. For example, the electrical connection between the electrode pads or inner electrodes and the outer electrodes may be achieved by extending extended electrodes onto the first principal surface 32a or the second principal surface 32b. Alternatively, the electrical connection between the electrode pads or inner electrodes and the outer electrodes may be made by forming the substrate 31 of the base member 30 in multiple layers, extending the via electrodes to an intermediate layer, and extending the extended electrodes on the intermediate layer.

As illustrated in FIG. 2, by joining the lid member 20 to the base member 30 with the sealing frame 40 and the joining material 50, the quartz crystal resonator 10 is sealed in the internal space 26 surrounded by the lid member 20 and the base member 30. In this case, the internal space 26 is preferably a vacuum in which the pressure is lower than atmospheric pressure. This can, for example, reduce aging of the first and second excitation electrodes 14a and 14b caused by oxidation.

The outer electrodes 35a to 35d on the second principal surface 32b are located outside the internal space 26. This allows the outer electrodes 35a to 35d to be electrically connected to a circuit board (not shown) on which the quartz crystal resonator unit 1 is to be mounted. When the circuit board supplies a ground potential to the outer electrodes 35c and 35d, the outer electrodes 35c and 35d serve as ground electrodes. By electrically connecting the lid member 20 to the outer electrodes 35c and 35d in this case, a higher electromagnetic shielding capability can be added to the lid member 20.

The sealing frame 40 and the joining material 50 are for joining the lid member 20 and the base member 30. The sealing frame 40 and the joining material 50 are disposed along the entire circumference of the lid member 20 and the base member 30. Specifically, as described above, the sealing frame 40 is disposed on the first principal surface 32a of the base member 30. The joining material 50 is disposed on the sealing frame 40.

As illustrated in FIG. 3, the sealing frame 40 has a frame shape in plan view of the first principal surface 32a of the base member 30. The electrode pads 33a and 33b are disposed inside the sealing frame 40. As illustrated in FIG. 4, the joining material 50 also has a frame shape in plan view of the first principal surface 32a of the base member 30. As described above, the connection electrodes 16a and 16b of the quartz crystal resonator 10 are connected to the electrode pads 33a and 33b, respectively, with the conductive retaining members 36a and 36b interposed therebetween. This allows the sealing frame 40 and the joining material 50 to surround the quartz crystal resonator 10.

The distance between the inner and outer edges (i.e., width dimension) of the frame shape of the sealing frame 40 and the joining material 50 is uniform throughout the circumference. The frame shape or joint region of the sealing frame 40 and the joining material 50 thus has a uniform width. This can reduce defects, such as voids, that used to be developed by varying width, and can also relieve stress concentration caused by thermal expansion or contraction that used to occur at a position where the width of the joint region varies. Therefore, damage to (or cracks in) the sealing frame 40 and the joining material 50 can be reduced, and this can reduce loss of hermeticity of the lid member 20 and the base member 30.

Specifically, the frame shape of the sealing frame 40 and the joining material 50 has inner and outer edges that are rectangular in shape. In the example illustrated in FIG. 3 and FIG. 4, the corners of the inner and outer edges are each rounded such that the width dimension of the frame shape is uniform throughout the circumference.

That is, the frame shape of the sealing frame 40 includes sides 41a to 41d and corners 42a to 42d. The frame shape of the joining material 50 similarly includes sides 51a to 51d and corners 52a to 52d. In plan view of the first principal surface 32a of the base member 30, the width dimension of the sides 41a to 41d and the sides 51a to 51d is equal to the width dimension of the corners 42a to 42d and the corners 52a to 52d. This facilitates formation of the sealing frame 40 and the joining material 50 having a joint region of uniform width. In the present embodiment, when, in plan view of the first principal surface 32a of the base member 30, the change rate of the width dimension of the joining material 50 is ±10% or less, the width dimension is regarded as being the same or uniform, in consideration of manufacturing variations.

Specifically, the sides 41a to 41d and the sides 51a to 51d each have a linear shape with a width dimension w1. The corners 42a to 42d and the corners 52a to 52d each include a rounded (R) portion. That is, the corners 42a to 42d and the corners 52a to 52d each include a corresponding one of first rounded portions 43a to 43d and first rounded portions 53a to 53d formed with a first radius r1, and include a corresponding one of second rounded portions 44a to 44d and second rounded portions 54a to 54d each concentric with, or having the same center as, the corresponding one of the first rounded portions 43a to 43d and the first rounded portions 53a to 53d and formed with a second radius r2 different from the first radius r1 (i.e., first radius r1≠second radius r2). In the example illustrated in FIG. 3 and FIG. 4, the first radius r1 is set to be greater than the second radius r2 (first radius r1>second radius r2).

In plan view of the first principal surface 32a of the base member 30, the difference between the first radius r1 and the second radius r2 is equal to the width dimension w1 of the sides 41a to 41d and the sides 51a to 51d (first radius r1−second radius r2=width dimension w1). The width dimension of the corners 42a to 42d and the corners 52a to 52d is thus equal to the width dimension w1 of the sides 41a to 41*d* and the sides 51*a* to 51*d*. This further facilitates formation of the sealing frame 40 and the joining material 50 having the joint region of uniform width.

The frame shape of the sealing frame 40 and the joining material 50 is not limited to the example illustrated in FIG. 3 and FIG. 4. The frame shape of the sealing frame 40 and the joining material 50 may be configured differently as long as its width dimension is uniform.

For example, the frame shape of the sealing frame 40 and the joining material 50 may differ from the example illustrated in FIG. 3 and FIG. 4, in terms of the configuration of the corners 42*a* to 42*d* and the corners 52*a* to 52*d*. As illustrated in FIG. 5, the corner 42*a* of the sealing frame 40 includes a linear portion 45*a*, a first curve 46*a* that connects the side 41*a* to the linear portion 45*a*, and a second curve 47*a* that connects the side 41*d* to the linear portion 45*a*. The first curve 46*a* and the second curve 47*a* each include the first rounded portion 43*a* formed with a first radius r1' and the second rounded portion 44*a* concentric with the first rounded portion 43*a* and formed with a second radius r2' different from the first radius r1' (i.e., first radius r1'≠second radius r2').

As illustrated in FIG. 6, the corner 52*a* of the joining material 50 includes a linear portion 55*a*, a first curve 56*a* that connects the side 51*a* to the linear portion 55*a*, and a second curve 57*a* that connects the side 51*d* to the linear portion 55*a*. In plan view of the first principal surface 32*a* of the base member 30, the linear portion 55*a* has the same width dimension w1 as the sides 51*a* and 51*d*. The first curve 56*a* and the second curve 57*a* each include the first rounded portion 53*a* formed with the first radius r1' and the second rounded portion 54*a* concentric with the first rounded portion 53*a* and formed with the second radius r2' different from the first radius r1' (i.e., first radius r1'≠second radius r2'). In the example illustrated in FIG. 5 and FIG. 6, the first radius r1' is set to be greater than the second radius r2' (first radius r1'>second radius r2'). The corners 42*b* to 42*d* (not shown) of the sealing frame 40 each include portions similar to those of the corner 42*a* illustrated in FIG. 5, and the corners 52*b* to 52*d* (not shown) of the joining material 50 each include portions similar to those of the corner 52*a* illustrated in FIG. 6.

In plan view of the first principal surface 32*a* of the base member 30, the difference between the first radius r1' and the second radius r2' is equal to the width dimension w1 of the sides 41*a* to 41*d* and the sides 51*a* to 51*d* (first radius r1'−second radius r2'=width dimension w1). In this configuration, again, the width dimension of the corners 42*a* to 42*d* and the corners 52*a* to 52*d* is equal to the width dimension w1 of the sides 41*a* to 41*d* and the sides 51*a* to 51*d*. This further facilitates formation of the sealing frame 40 and the joining material 50 having the joint region of uniform width.

In the present application, the term "rectangular" may mean that the four corners of a rectangle do not necessarily have a right angle and are, for example, each rounded or cut off to form a linear portion. Also, the term "rectangle" in the present application does not exclude a square, and may refer to either a rectangle with two different side lengths or a rectangle with equal sides (square). Also, the term "same" or "equal" in the present application does not exclude tolerances or the presence of errors, and may refer to being substantially the same.

The sealing frame 40 and the joining material 50 are each made of, for example, a metal material. The sealing frame 40 is formed, for example, by stacking a molybdenum (Mo) layer, a nickel (Ni) layer, and a gold (Au) layer. The joining material 50 is made of, for example, an alloy of a plurality of metals. Specifically, the joining material 50 is made of, for example, a gold-tin (Au-Sn) eutectic alloy. Thus, when the lid member 20 is made of a metal material, metal-to-metal bonding is created between the lid member 20 and the sealing frame 40 and the joining material 50, and this enables formation of an alloy layer. As a result, as compared to the cases where the lid member 20, the sealing frame 40, and the joining material 50 are made of non-metal materials, the lid member 20 and the base member 30 can provide better hermeticity.

In the quartz crystal resonator 10 according to the present embodiment, one end of the quartz crystal element 11 in the long-side direction (i.e., the end portion adjacent to the conductive retaining members 36*a* and 36*b*) is a fixed end, whereas the other end of the quartz crystal element 11 is a free end. The quartz crystal resonator 10, the lid member 20, and the base member 30 are all rectangular in the XZ'-plane, and have the same long-side direction and the same short-side direction.

The position of the fixed end of the quartz crystal resonator 10 is not particularly limited. For example, a modification may be made such that the quartz crystal resonator 10 is secured to the base member 30 at both ends of the quartz crystal element 11 in the long-side direction. In this case, the electrodes of both the quartz crystal resonator 10 and the base member 30 may be formed such that the quartz crystal resonator 10 is secured at both ends of the quartz crystal element 11 in the long-side direction.

In the quartz crystal resonator unit 1 according to the present embodiment, an alternating electric field is applied, through the outer electrodes 35*a* and 35*b* of the base member 30, between the first and second excitation electrodes 14*a* and 14*b* forming a set in the quartz crystal resonator 10. This causes the vibrating portion of the quartz crystal element 11 to vibrate in a predetermined vibration mode, such as a thickness shear mode, and provides resonance characteristics associated with the vibration.

Figure 7:
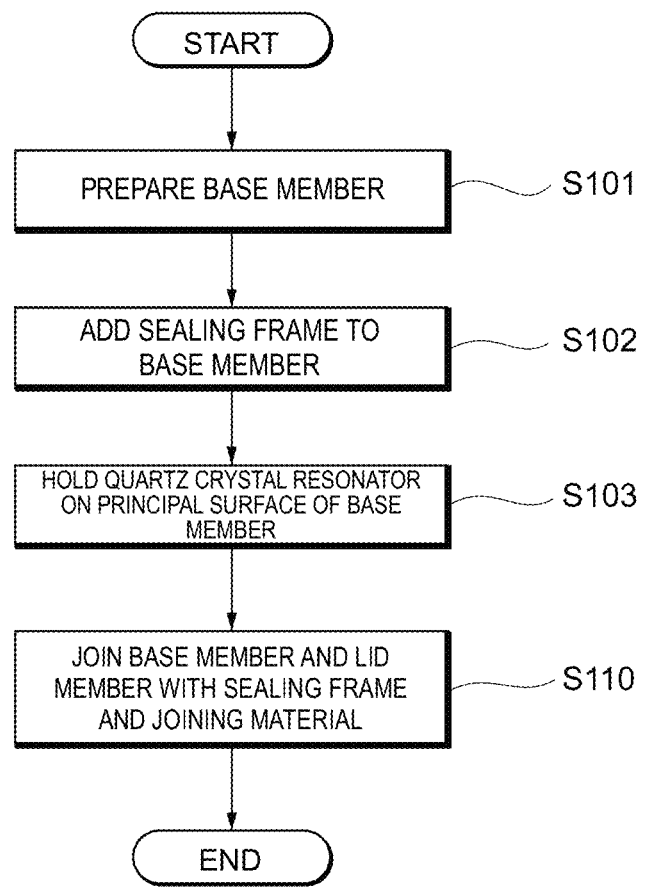
FIG. 7 is a flowchart illustrating a method for manufacturing the quartz crystal resonator unit according to the first embodiment of the present invention.
Figure 8:
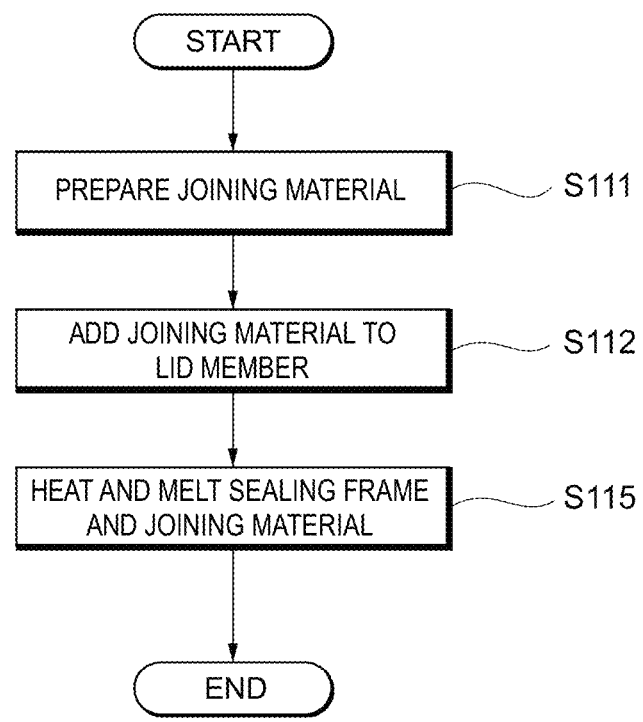
FIG. 8 is a flowchart illustrating details of the process of how the base member and a lid member are joined.
Figure 9:
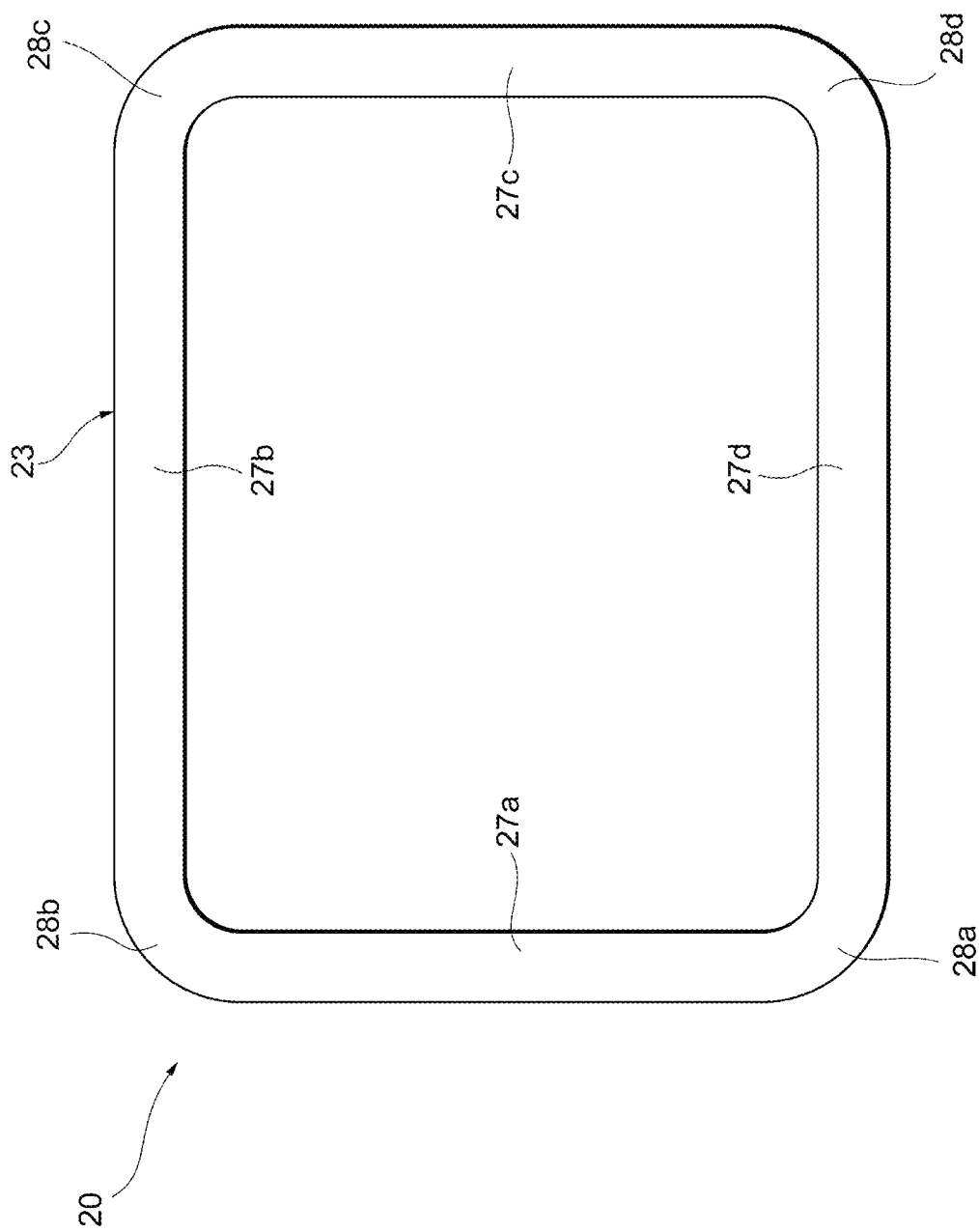
FIG. 9 is a diagram illustrating the process of how the joining material is added to the lid member.
Figure 10:
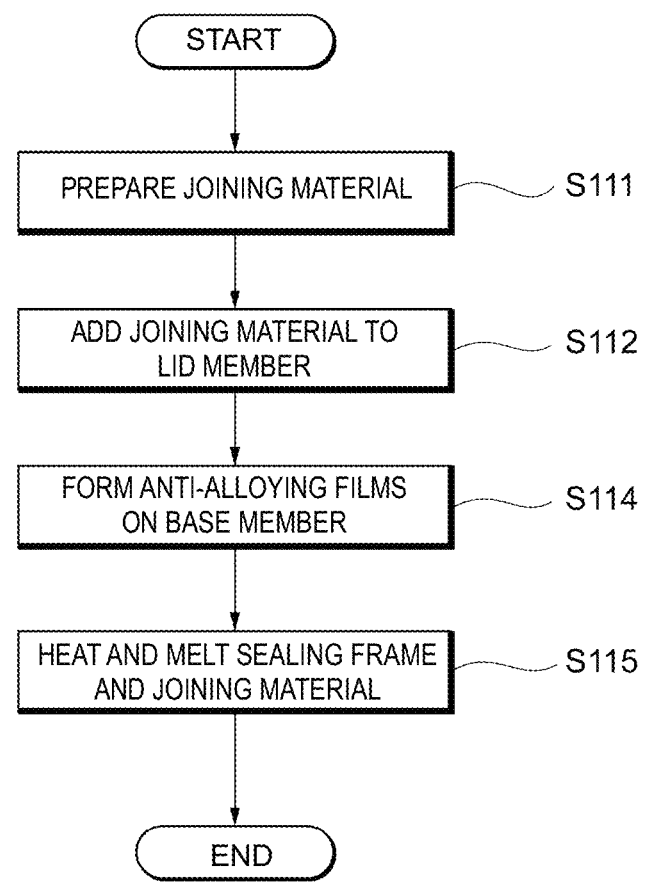
FIG. 10 is a flowchart illustrating an exemplary modification of the details of the process of how the base member and the lid member are joined.
Figure 11:
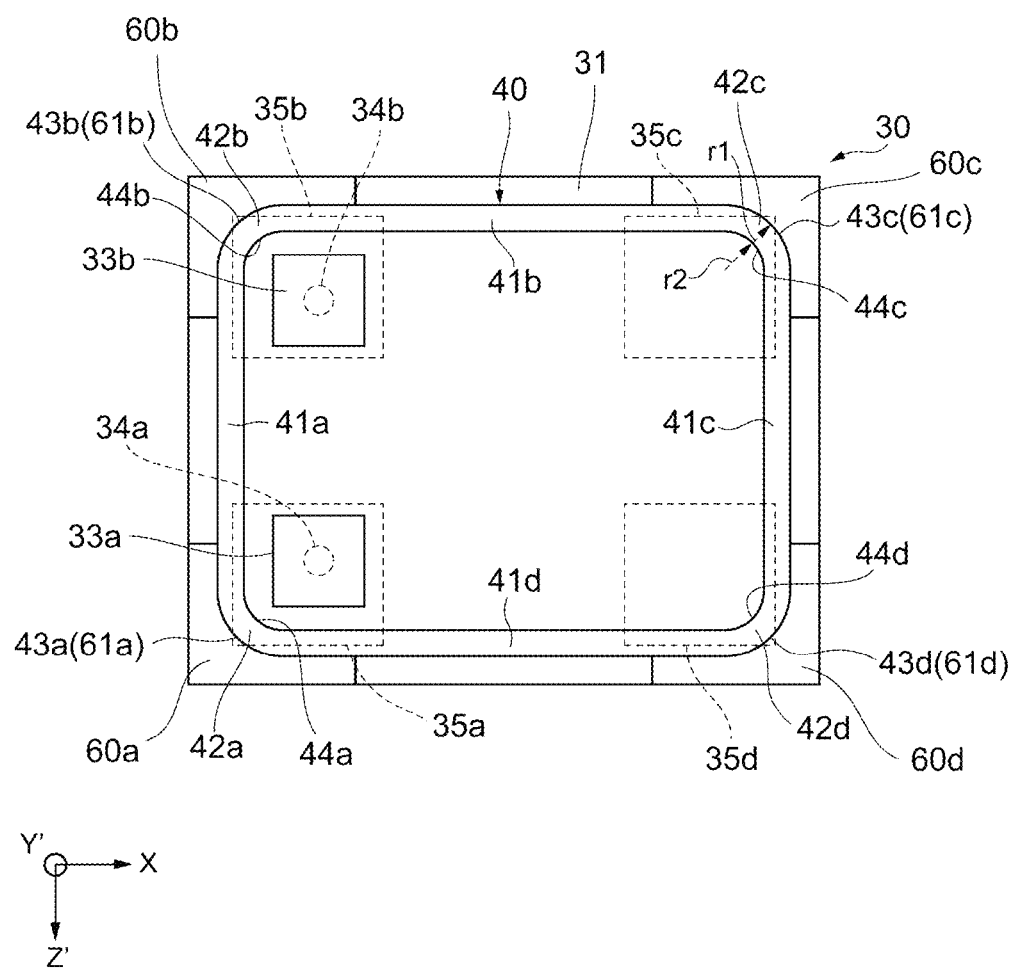
FIG. 11 is a diagram illustrating the process of how anti-alloying films are positioned on the base member.

A method for manufacturing the quartz crystal resonator unit according to the first embodiment of the present invention will now be described with reference to FIG. 7 to FIG. 11. FIG. 7 is a flowchart illustrating a method for manufacturing the quartz crystal resonator unit 1. FIG. 8 is a flowchart illustrating details of the process of how the base member 30 and the lid member 20 are joined. FIG. 9 is a diagram illustrating the process of how the joining material 50 is added to the lid member 20. FIG. 10 is a flowchart illustrating an exemplary modification of the details of the process of how the base member 30 and the lid member 20 are joined. FIG. 11 is a diagram illustrating the process of how anti-alloying films 60*a* to 60*d* are positioned on the base member 30.

As in FIG. 7, first, the base member 30 is prepared (S101). Specifically, for example, the electrode pads 33*a* and 33*b*, the via electrodes 34*a* and 34*b*, and the outer electrodes 35*a* to 35*d* are formed on or in the substrate 31, which is an insulating ceramic (e.g., alumina) member.

Next, the sealing frame 40 is added to the base member 30 (S102). Specifically, after a molybdenum (Mo) paste is applied by screen printing to the first principal surface 32*a* of the substrate 31, the paste is heated and sintered to form the sealing frame 40. Then, the surface of the sealing frame 40 is plated with nickel (Ni) and gold (Au).

Next, the quartz crystal resonator 10 prepared in advance is held on the first principal surface 32*a* of the base member 30 (S103).

Specifically, a conductive adhesive is applied onto the electrode pads 33*a* and 33*b* on the first principal surface 32*a* of the substrate 31, and the conductive adhesive is thermally hardened, with the quartz crystal resonator 10 mounted thereon. By the conductive retaining members 36a and 36b obtained by hardening the conductive adhesive, the connection electrodes 16a and 16b of the quartz crystal resonator 10 are electrically connected to the electrode pads 33a and 33b, respectively, of the base member 30. The conductive retaining members 36a and 36b retain the quartz crystal resonator 10 such that the quartz crystal resonator 10 can be excited. The quartz crystal resonator 10 is mounted, with the second excitation electrode 14b facing the first principal surface 32a of the base member 30.

The step of processing the quartz crystal element and the step of forming various electrodes are carried out by commonly used techniques, and the quartz crystal resonator 10 is configured as already described above. Therefore, the description of how the quartz crystal resonator 10 is prepared is omitted here.

Next, the base member 30 and the lid member 20 are joined by the sealing frame 40 and the joining material 50 (S110). As described above, the frame shape of the sealing frame 40 and the joining material 50 is uniform in width throughout the circumference. The frame shape or joint region of the sealing frame 40 and the joining material 50 thus has a uniform width. This can reduce defects, such as voids, that used to be developed by varying width, and can also relieve stress concentration caused by thermal expansion or contraction that used to occur at a position where the width of the joint region varies. Therefore, damage to (or cracks in) the sealing frame 40 and the joining material 50 can be reduced, and this can reduce loss of hermeticity of the lid member 20 and the base member 30.

Specifically, as in FIG. 8, the joining material 50 is prepared (S111). The joining material 50 is, for example, a gold-tin (Au-Sn) eutectic alloy plate. The alloy plate is, for example, blanked into a rectangular frame shape illustrated in FIG. 4.

Next, the joining material 50 is added to the lid member 20 (S112). As illustrated in FIG. 9, the counter face 23 of the lid member 20 has a frame shape in plan view of a surface including the opening (not shown) of the lid member 20. The frame shape of the counter face 23 is the same as the frame shape of the sealing frame 40 illustrated in FIG. 3. That is, the frame shape of the counter face 23 is a rectangular shape including sides 27a to 27d and corners 28a to 28d. The width of the sides 27a to 27d is equal to the width of the corners 28a to 28d.

Before addition of the joining material 50, the counter face 23 of the lid member 20 is plated with nickel (Ni) and gold (Au). Then, the joining material 50 is thermally fused to the plated counter face 23. The shape of the surface of the joining material 50 fused to the counter face 23 depends on the shape of the counter face 23. Therefore, even if the joining material 50 is not processed with high accuracy, the joining material 50 having a frame shape of uniform width is obtained.

Referring back to FIG. 8, the counter face 23 of the lid member 20 is placed onto the sealing frame 40 on the base member 30, and the sealing frame 40 and the joining material 50 are heated and melted (S115). Specifically, the sealing frame 40 and the joining material 50 are melted by being heated for five minutes at 320° C. and subjected to pressure. Thus, when the lid member 20 is a metal member, metal-to-metal bonding is created between the lid member 20 and the sealing frame 40 and the joining material 50, and this enables formation of an alloy layer. The lid member 20 and the base member 30 are thus fused and joined, with the sealing frame 40 and the joining material 50 therebetween, and improved joint strength is achieved. As a result, as compared to the cases where the lid member 20, the sealing frame 40, and the joining material 50 are non-metal members, the lid member 20 and the base member 30 can provide better hermeticity.

The shape of the surface of the joining material 50 melted together with the sealing frame 40 depends on the shape of the sealing frame 40. Therefore, even if the joining material 50 is not processed with high accuracy, the joining material 50 having a frame shape of uniform width is obtained.

The base member 30 and the lid member 20 can thus be joined by the sealing frame 40 and the joining material 50.

The process for joining the base member 30 and the lid member 20 is not limited to the manufacturing process illustrated in FIG. 8. For example, as in FIG. 10, heating and melting the sealing frame 40 and the joining material 50 in step S115 is preceded by forming anti-alloying films on the base member 30 (S114).

Specifically, as illustrated in FIG. 11, anti-alloying films 60a to 60d are each formed adjacent to a corresponding one of the corners 42a to 42d of the sealing frame 40, on the first principal surface 32a of the substrate 31. The anti-alloying films 60a to 60d are made of a material that prevents alloying. Specifically, for example, the anti-alloying films 60a to 60d are glass films. The anti-alloying films 60a to 60d include rounded portions 61a to 61d each formed with the first radius r1.

Forming the anti-alloying films 60a to 60d adjacent to the corners 42a to 42d is followed by step S115 of FIG. 10, where the sealing frame 40 and the joining material 50 are melted, with the lid member 20 placed on the sealing frame 40 of the base member 30. The first rounded portions 43a to 43d and the first rounded portions 53a to 53d are formed by the anti-alloying films 60a to 60d at this point. The sealing frame 40 and the joining material 50 melt along the contours of the anti-alloying films 60a to 60d, that is, along the rounded portions 61a to 61d to form the first rounded portions 43a to 43d and the first rounded portions 53a to 53d. Therefore, even if the sealing frame 40 and the joining material 50 are not processed with high accuracy, the first rounded portions 43a to 43d and the first rounded portions 53a to 53d can be formed with high accuracy.

After the sealing frame 40 and the joining material 50 are heated and melted, the anti-alloying films 60a to 60d may remain unremoved on the first principal surface 32a of the base member 30. As described above, when the base member 30 includes the anti-alloying films 60a to 60d adjacent to the corners 42a to 42d of the sealing frame 40 and the corners 52a to 52d of the joining material 50, the sealing frame 40 and the joining material 50 melt along the contours of the adjacent anti-alloying films 60a to 60d to form the corners 42a to 42d and the corners 52a to 52d. The width dimension of the corners 42a to 42d of the sealing frame 40 and the corners 52a to 52d of the joining material 50 can thus be made uniform with high accurately.

FIG. 11 illustrates an example where the anti-alloying films 60a to 60d are arranged adjacent to the respective outer edges of the corners 42a to 42d of the sealing frame 40, but the configuration is not limited to this. The anti-alloying films 60a to 60d may be replaced by, or arranged together with, anti-alloying films arranged adjacent to the respective inner edges of the corners 42a to 42d of the sealing frame 40. This enables accurate formation of the second rounded portions 44a to 44d and the second rounded portions 54a to 54d.

Experiments were performed on samples prepared for the quartz crystal resonator unit 1 according to the present embodiment. Results of the experiments will now be described.

For the quartz crystal resonator unit manufactured under the conditions described below, two leak tests were performed on sample A including corners with rounded (R) portions according to the present embodiment, and sample B including right-angled corners, that is, corners without rounded (R) portions according to a comparative example. As described below, sample A exhibited better results in the leak tests.

(Manufacturing Conditions)

Conditions common to samples A and B are as follows. Samples A and B are hermetic sealing quartz crystal resonator units with external dimensions of 1.2 mm×1.0 mm (long-side direction x short-side direction). The quartz crystal resonator units each include a quartz crystal element, a 0.125-mm-thick alumina base member configured to hold the quartz crystal element thereon, and a lid member which is a tray-shaped metal cap. A joining material is a gold-tin (Au-Sn) alloy, and a sealing frame has a molybdenum (Mo) surface plated with nickel (Ni) and gold (Au). A width dimension for forming a hermetic sealing structure was set to 0.1 mm. The tray-shaped metal cap was formed with external dimensions of 1.2 mm×1.0 mm×0.16 mm (long-side direction×short-side direction×height), and the top portion 21 and the side wall portion 22 were formed with a thickness of 0.06 mm. The lid member and the base member were heated at 320° C. and fused, with the sealing frame and the joining material therebetween.

The sealing frame and the joining material were formed into a frame shape with a width dimension of 0.1 mm and external dimensions of 1.2 mm×1.0 mm (long-side direction×short-side direction).

Sample A including corners with rounded (R) portions was formed with the first radius r1 of 0.15 mm and the second radius r2 of 0.05 mm. This means that the corners of sample A have a width dimension of 0.1 mm. On the other hand, the corners of sample B including right-angled corners have a width dimension of $0.1 \times \sqrt{2}$ mm ($\approx 0.14$ mm).

(Test Method 1)

The amount of leakage in hermetically sealed products of samples A and B was measured with a helium leak detector. If the detected amount of leakage was $1 \times 10^{-9}$ Pa·m$^3$/s or more, the product was determined to be defective, whereas if the detected amount of leakage was below that value, then the product was determined to be non-defective.

(Test Result)

The table below shows that unlike the products of sample B, the products of sample A include no defective ones (poor-hermeticity products).

TABLE 1

| CORNERS | PRODUCTS PRODUCED | POOR-HERMETICITY PRODUCTS | DEFECT RATE |
|---|---|---|---|
| NOT ROUNDED | 6,720 | 27 | 0.40% |
| ROUNDED | 6,720 | 0 | 0.00% |

(Test Method 2)

A pressure cooker test was performed on the products of samples A and B that were determined to be non-defective by the helium leak detector. The pressure cooker test was performed under conditions of 121° C., 100%, 2 atm, and 192 hours based on the JESD22-A102 standard. The resonant frequencies of the products of samples A and B were measured before and after the pressure cooker test. If the change rate of the resonant frequency was ±5 ppm or more, the product was determined to be defective, whereas if the change rate was below that value, then the product was determined to be non-defective.

(Test Result)

The table below also shows that unlike the products of sample B, the products of sample A include no defective ones (poor-hermeticity products).

TABLE 2

| CORNERS | PRODUCTS PRODUCED | POOR-HERMETICITY PRODUCTS | DEFECT RATE |
|---|---|---|---|
| NOT ROUNDED | 1,000 | 3 | 0.30% |
| ROUNDED | 1,000 | 0 | 0.00% |

<Second Embodiment>

A quartz crystal resonator unit according to a second embodiment of the present invention will now be described with reference to FIG. 12. In the second embodiment and other embodiments that follow, the description of matters in common with the first embodiment will be omitted and differences alone will be described. In particular, the same advantageous effect achieved with the same configuration will not be repeated in each embodiment.

Figure 12:
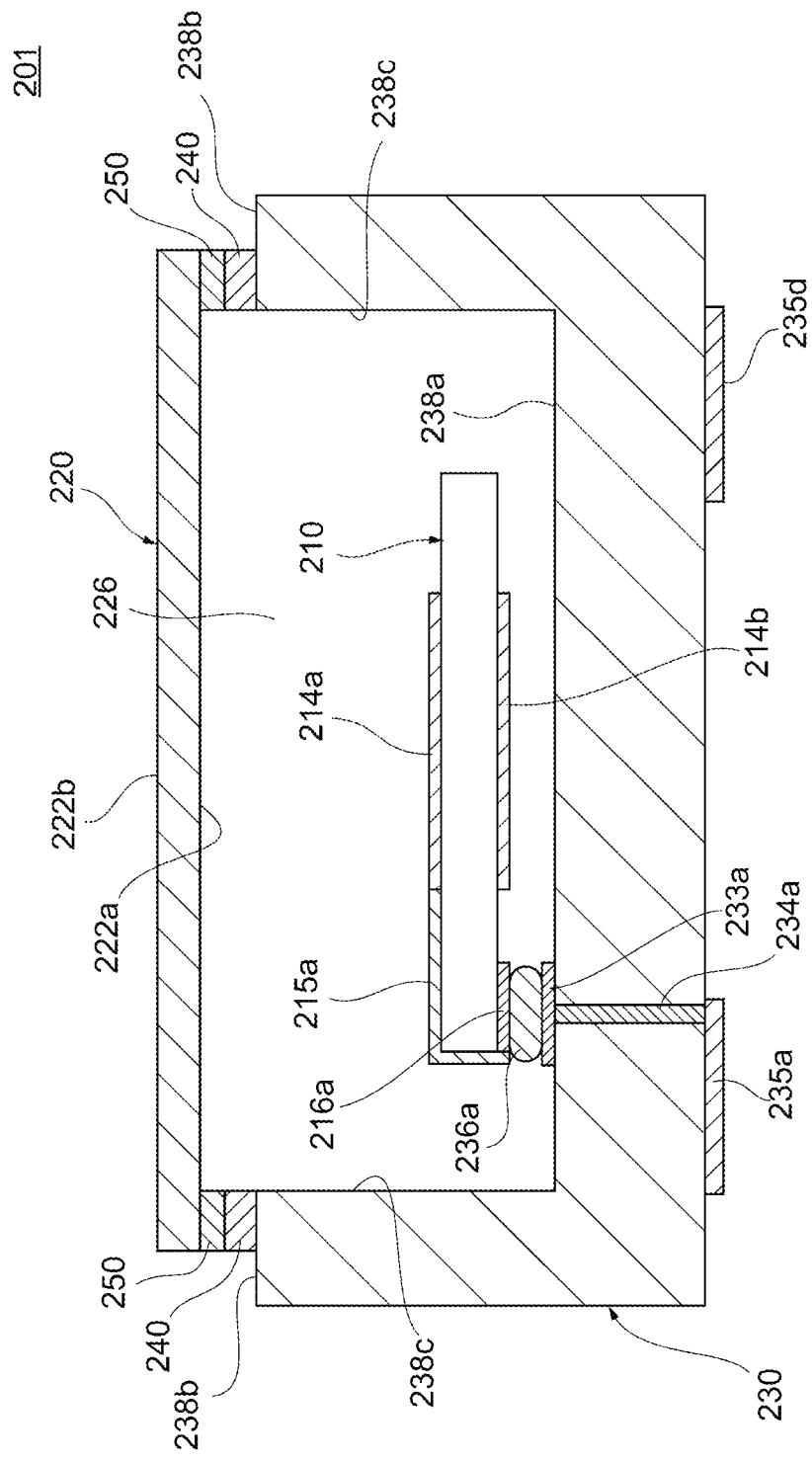
FIG. 12 is a cross-sectional view of a quartz crystal resonator unit according to a second embodiment of the present invention.

FIG. 12 is a cross-sectional view of a quartz crystal resonator unit 201 according to the second embodiment of the present invention. The cross-sectional view of FIG. 12 corresponds to FIG. 2. The exemplary configuration of the second embodiment illustrated in FIG. 12 differs from the exemplary configuration of the first embodiment illustrated in FIG. 2 in that a lid member 220 is a flat plate-like member and a base member 230 has a box shape with an opening.

The base member 230 has, on the side adjacent to the lid member 220, an inner bottom surface 238a, a counter face 238b, and an inner side surface 238c. The inner bottom surface 238a and the counter face 238b face a first principal surface 222a of the lid member 220. The inner bottom surface 238a is located in the center on the side adjacent to the lid member 220. The inner bottom surface 238a has a quartz crystal resonator 210 mounted thereon. The inner side surface 238c is a surface that connects the inner bottom surface 238a to the counter face 238b. In plan view of the inner bottom surface 238a, the counter face 238b is located outside the inner bottom surface 238a and has a frame shape. The counter face 238b has thereon a sealing frame 240 that extends throughout the circumference. As in the case of the sealing frame 40 illustrated in FIG. 3, the frame shape of the sealing frame 240 includes sides and corners (not shown). The corners each include first and second rounded portions (not shown).

The lid member 220 has the first principal surface 222a and a second principal surface 222b opposite each other. The outer region of the first principal surface 222a has thereon a joining material 250 that extends throughout the circumference. As in the case of the joining material 50 illustrated in FIG. 4, the frame shape of the joining material 250 includes sides and corners (not shown). The corners each include first and second rounded portions (not shown). The sealing frame 240 and the joining material 250 join the base member 230 and the lid member 220 and seal an internal space 226. The quartz crystal resonator 210 is placed in the internal space 226.

Figure 13:
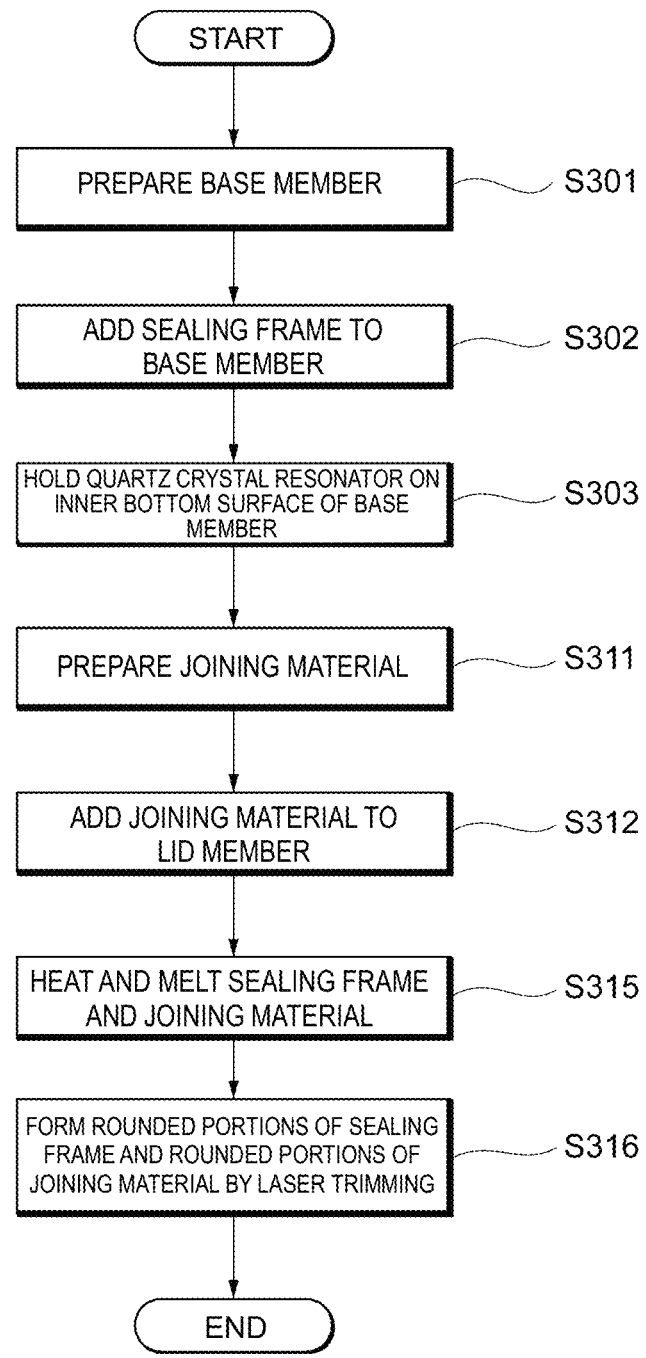
FIG. 13 is a flowchart illustrating a method for manufacturing the quartz crystal resonator unit according to the second embodiment of the present invention.
Figure 14:
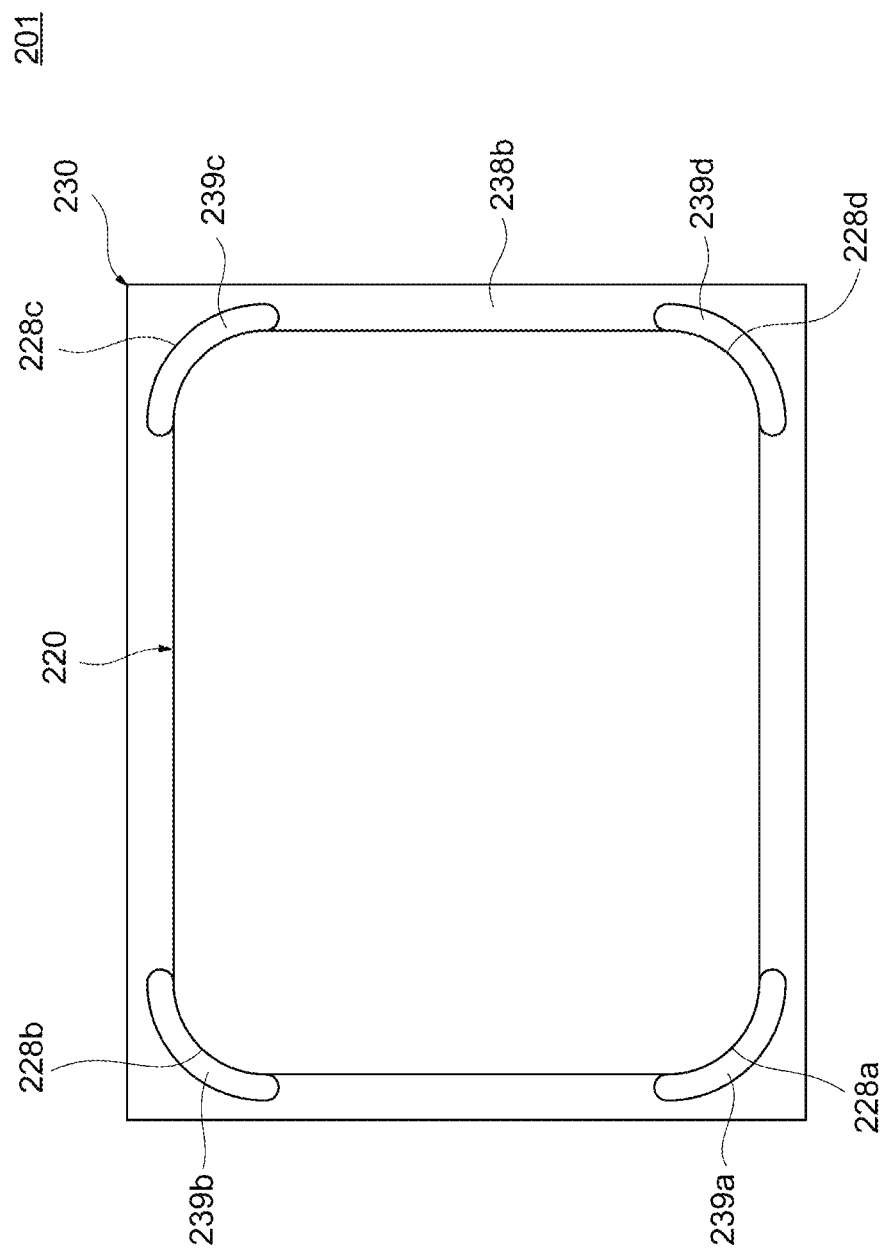
FIG. 14 is a diagram illustrating the process of how rounded portions of the sealing frame and the joining material are formed.

A method for manufacturing the quartz crystal resonator unit according to the second embodiment of the present invention will now be described with reference to FIG. 13 and FIG. 14. FIG. 13 is a flowchart illustrating a method for manufacturing the quartz crystal resonator unit 201. FIG. 14 is a diagram illustrating the process of how rounded portions of the sealing frame 240 and the joining material 250 are formed.

As in FIG. 13, first, the base member 230 is prepared (S301). Specifically, the inner bottom surface 238a, the counter face 238b, and the inner side surface 238c of the base member 230 are formed, for example, by etching. The step of preparing the other components of the base member 230 will not be described here, as it is the same as step S101 of the first embodiment illustrated in FIG. 7.

Next, the sealing frame 240 is added to the base member 230 (S302). Specifically, after a molybdenum (Mo) paste is applied by screen printing to the counter face 238b of the base member 230, the paste is heated and sintered to form the sealing frame 240. Then, the surface of the sealing frame 240 is plated with nickel (Ni) and gold (Au).

Next, the quartz crystal resonator 210 prepared in advance is held on the inner bottom surface 238a of the base member 230 (S303).

Next, the base member 230 and the lid member 220 are joined by the sealing frame 240 and the joining material 250.

Specifically, the joining material 250 is prepared (S311). The joining material 50 is, for example, a gold-tin (Au-Sn) eutectic alloy plate. The alloy plate is, for example, blanked into a rectangular frame shape illustrated in FIG. 4.

Next, the joining material 250 is added to the lid member 220 (S312). Before addition of the joining material 250, the first principal surface 222a of the lid member 220 is plated with nickel (Ni) and gold (Au). Then, the joining material 250 is thermally fused to the plated outer region of the first principal surface 222a.

Next, the outer region of the first principal surface 222a of the lid member 220 is placed onto the sealing frame 240 on the base member 230, and the sealing frame 240 and the joining material 250 are heated and melted (S315). Specifically, the sealing frame 240 and the joining material 250 are melted by being heated for five minutes at 320° C. and subjected to pressure.

Next, the sealing frame 240 and the joining material 250 are partially ground away by laser trimming to form first rounded portions of the sealing frame 240 and first rounded portions of the joining material 250 (S316). Thus, even if the sealing frame 240 and the joining material 250 are not processed with high accuracy, the first rounded portions of the sealing frame 240 and the first rounded portions of the joining material 250 can be formed with high accuracy.

Together with the sealing frame 240 and the joining material 250, the lid member 220 is also partially ground away by laser trimming. Thus, the lid member 220 has rounded corners 228a to 228d as illustrated in FIG. 14. The counter face 238b of the base member 230 has grooves 239a to 239d formed adjacent to the corners 228a to 228d by laser trimming. That is, the grooves 239a to 239d are formed adjacent to the respective corners of the sealing frame 240 and the respective corners of the joining material 250. Thus, during formation of the grooves 239a to 239d, the adjacent corners of the sealing frame 240 and the adjacent corners of the joining material 250 are also formed. The width of the corners of the sealing frame 240 and the corners of the joining material 250 can thus be made uniform with high accuracy.

Exemplary embodiments of the present invention have been described. The quartz crystal resonator unit 1 includes the quartz crystal resonator 10, the lid member 20 and the base member 30 configured to accommodate the quartz crystal resonator 10, and the sealing frame 40 and the joining material 50 configured to join the lid member 20 and the base member 30. In plan view of the first principal surface 32a of the base member 30, the sealing frame 40 and the joining material 50 have a frame shape of uniform width surrounding the quartz crystal resonator 10. That is, the frame shape or joint region of the sealing frame 40 and the joining material 50 has a uniform width. This can reduce defects, such as voids, that used to be developed by varying width, and can also relieve stress concentration caused by thermal expansion or contraction that used to occur at a position where the width of the joint region varies. Therefore, damage to (or cracks in) the sealing frame 40 and the joining material 50 can be reduced, and this can reduce loss of hermeticity of the lid member 20 and the base member 30.

In the quartz crystal resonator unit 1 described above, the lid member 20, the sealing frame 40, and the joining material 50 are each made of a metal material. This creates metal-to-metal bonding between the lid member 20 and the sealing frame 40 and the joining material 50 and enables formation of an alloy layer. Thus, as compared to the cases where the lid member 20, the sealing frame 40, and the joining material 50 are made of non-metal materials, the lid member 20 and the base member 30 can provide better hermeticity.

In the quartz crystal resonator unit 1 described above, the frame shape is a rectangular shape including the sides 41a to 41d and the sides 51a to 51d, and the corners 42a to 42d and the corners 52a to 52d. In plan view of the first principal surface 32a of the base member 30, the width dimension of the sides 41a to 41d is equal to the width dimension of the corners 42a to 42d. This facilitates formation of the sealing frame 40 and the joining material 50 having a joint region of uniform width.

In the quartz crystal resonator unit 1 described above, the corners 42a to 42d and the corners 52a to 52d each include a corresponding one of the first rounded portions 43a to 43d and the first rounded portions 53a to 53d formed with the first radius r1, and a corresponding one of the second rounded portions 44a to 44d and the second rounded portions 54a to 54d each concentric with the corresponding one of the first rounded portions 43a to 43d and the first rounded portions 53a to 53d and formed with the second radius r2 different from the first radius r1. In plan view of the first principal surface 32a of the base member 30, the difference between the first radius r1 and the second radius r2 is equal to the width dimension w1 of the sides 41a to 41d and the sides 51a to 51d. The width dimension of the corners 42a to 42d and the corners 52a to 52d is thus equal to the width dimension w1 of the sides 41a to 41d and the sides 51a to 51d. This further facilitates formation of the sealing frame 40 and the joining material 50 having the joint region of uniform width.

In the quartz crystal resonator unit 1 described above, the corners 42a to 42d and the corners 52a to 52d each include a corresponding one of the linear portions 45a to 45d and the linear portions 55a to 55d having the same width dimension as the sides 41a to 41d and the sides 51a to 51d in plan view of the first principal surface 32a of the base member 30, a corresponding one of the first curves 46a to 46d and the first curves 56a to 56d each connecting the corresponding one of the sides 41a to 41d and the sides 51a to 51d to the corresponding one of the linear portions 45a to 45d and the linear portions 55a to 55d, and a corresponding one of the second curves 47a to 47d and the second curves 57a to 57d each connecting another corresponding one of the sides 41a to 41d and the sides 51a to 51d to the corresponding one of the linear portions 46a to 46d and the linear portions 56a to 56d. The first curves 46a to 46d and the first curves 56a to 56d and the second curves 47a to 47d and the second curves 57a to 57d each include a corresponding one of the first rounded portions 43a to 43d and the first rounded portions 53a to 53d formed with the first radius r1', and a corresponding one of the second rounded portions 44a to 44d and the second rounded portions 54a to 54d each concentric with the corresponding one of the first rounded portions 43a to 43d and the first rounded portions 53a to 53d and formed with the second radius r2' different from the first radius r1'. The difference between the first radius r1' and the second radius r2' is equal to the width dimension w1 of the linear portions in plan view of the first principal surface 32a of the base member 30. With this configuration, again, the width dimension of the corners 42a to 42d and the corners 52a to 52d is equal to the width dimension w1 of the sides 41a to 41d and the sides 51a to 51d. This further facilitates formation of the sealing frame 40 and the joining material 50 having the joint region of uniform width.

In the quartz crystal resonator unit 1 described above, the base member 30 includes the anti-alloying films 60a to 60d each adjacent to a corresponding one of the corners 42a to 42d and a corresponding one of the corners 52a to 52d. This allows the sealing frame 40 and the joining material 50 to melt along the contours of the adjacent anti-alloying films 60a to 60d to form the corners 42a to 42d and the corners 52a to 52d. The width dimension of the corners 42a to 42d of the sealing frame 40 and the corners 52a to 52d of the joining material 50 can thus be accurately made uniform with high accurately.

In the quartz crystal resonator unit 201, the base member 230 includes the grooves 239a to 239d formed adjacent to the respective corners of the sealing frame 240 and the respective corners of the joining material 250. Thus, during formation of the grooves 239a to 239d, the adjacent corners of the sealing frame 240 and the adjacent corners of the joining material 250 are also formed. The width dimension of the corners of the sealing frame 240 and the corners of the joining material 250 can thus be made uniform with high accurately.

The method for manufacturing the quartz crystal resonator unit 1 includes the steps of preparing the base member 30, holding the quartz crystal resonator 10 on the first principal surface 32a of the base member, and joining the base member 30 and the lid member 20 with the sealing frame 40 and the joining material 50. In plan view of the first principal surface 32a of the base member 30, the sealing frame 40 and the joining material 50 have a frame shape surrounding the quartz crystal resonator 10, and the frame shape has a uniform width. This can reduce defects, such as voids, that used to be developed by varying width, and can also relieve stress concentration caused by thermal expansion or contraction that used to occur at a position where the width of the joint region varies. Therefore, damage to (or cracks in) the sealing frame 40 and the joining material 50 can be reduced, and this can reduce loss of hermeticity of the lid member 20 and the base member 30.

In the method for manufacturing the quartz crystal resonator unit 1 described above, the lid member 20, the sealing frame 40, and the joining material 50 are each made of a metal material, and the step of joining includes heating and melting the sealing frame 40 and the joining material 50. This creates metal-to-metal bonding between the lid member 20 and the sealing frame 40 and the joining material 50 and enables formation of an alloy layer. The lid member 20 and the base member 30 are thus fused and joined, with the sealing frame 40 and the joining material 50 therebetween, and improved joint strength is achieved. Thus, as compared to the cases where the lid member 20, the sealing frame 40, and the joining material 50 are made of non-metal materials, the lid member 20 and the base member 30 can provide better hermeticity.

In the method for manufacturing the quartz crystal resonator unit 1 described above, the frame shape is a rectangular shape including the corners 42a to 42d and the corners 52a to 52d, and the corners 42a to 42d and the corners 52a to 52d each include a corresponding one of the first rounded portions 43a to 43d and the first rounded portions 53a to 53d. The step of joining includes positioning the anti-alloying films 60a to 60d each adjacent to a corresponding one of the corners 42a to 42d and a corresponding one of the corners 52a to 52d, and forming the first rounded portions 43a to 43d and the first rounded portions 53a to 53d using the anti-alloying films 60a to 60d. The sealing frame 40 and the joining material 50 melt along the contours of the anti-alloying films 60a to 60d, that is, along the rounded portions 61a to 61d to form the first rounded portions 43a to 43d and the first rounded portions 53a to 53d. Therefore, even if the sealing frame 40 and the joining material 50 are not processed with high accuracy, the first rounded portions 43a to 43d and the first rounded portions 53a to 53d can be formed with high accuracy.

In the method for manufacturing the quartz crystal resonator unit 201, the inner and outer edges of the frame shape have a rectangular shape including corners. The corners each include a first rounded portion, and the step of joining includes forming the first rounded portion by partially removing the sealing frame 240 and the joining material 250 through laser trimming. Thus, even if the sealing frame 240 and the joining material 250 are not processed with high accuracy, the first rounded portions of the sealing frame 240 and the first rounded portions of the joining material 250 can be formed with high accuracy.

The embodiments described above are intended to facilitate understanding of the present invention, and are not intended to interpret the present invention in a limiting sense. The present invention can be changed or improved without departing from the scope thereof, and the present invention includes equivalents thereof. That is, embodiments to which design changes are appropriately made by those skilled in the art are also included in the scope of the present invention, as long as they have the features of the present invention. For example, the elements of the embodiments and their arrangements, materials, conditions, shapes, and sizes are not limited to the illustrated ones and can be changed appropriately. The embodiments are merely examples. Some of configurations presented in different embodiments may be replaced or combined, and may also be included in the scope of the present invention, as long as they have the features of the present invention.

REFERENCE SIGNS LIST

1: quartz crystal resonator unit, 10: quartz crystal resonator, 11: quartz crystal element, 12a: first principal surface, 12b: second principal surface, 14a: first excitation electrode, 14b: second excitation electrode, 15a: extended electrode, 15b: extended electrode, 16a: connection electrode, 16b: connection electrode, 20: lid member, 21: top portion, 22: side wall portion, 23: counter face, 24: inner surface, 25:

outer surface, 26: internal space, 27a, 27b, 27c, 27d: side, 28a, 28b, 28c, 28d: corner, 30: base member, 31: substrate, 32a: first principal surface, 32b: second principal surface, 33a, 33b: electrode pad, 34a, 34b: via electrode, 35a, 35b, 35c, 35d: outer electrode, 36a, 36b: conductive retaining member, 40: sealing frame, 41a, 41b, 41c, 41d: side, 42a, 42b, 42c, 42d: corner, 43a, 43b, 43c, 43d: first rounded portion, 44a, 44b, 44c, 44d: second rounded portion, 45a, 45b, 45c, 45d: linear portion, 46a, 46b, 46c, 46d: first curve, 47a, 47b, 47c, 47d: second curve, 50: joining material, 51a, 51b, 51c, 51d: side, 52a, 52b, 52c, 52d: corner, 53a, 53b, 53c, 53d: first rounded portion, 54a, 54b, 54c, 54d: second rounded portion, 55a, 55b, 55c, 55d: linear portion, 56a, 56b, 56c, 56d: first curve, 57a, 57b, 57c, 57d: second curve, 60a, 60b, 60c, 60d: anti-alloying film, 201: quartz crystal resonator unit, 210: quartz crystal resonator, 220: lid member, 222a: first principal surface, 222b: second principal surface, 226: internal space, 228a, 228b, 228c, 228d: corner, 230: base member, 238a: inner bottom surface, 238b: counter face, 238c: inner side surface, 239a, 239b, 239c, 239d: groove, 240: sealing frame, 250: joining material, r1, r1': first radius, r2, r2': second radius, w1: width dimension

The invention claimed is:

1. A piezoelectric resonator unit comprising:
a piezoelectric resonator;
a lid member and a base member defining an internal space that accommodates the piezoelectric resonator; and
a joining member joining the lid member and the base member,
wherein in a plan view of a principal surface of the base member, the joining member has a frame shape with a uniform width dimension surrounding the piezoelectric resonator,
wherein the frame shape is a rectangular shape including sides and corners, and in the plan view of the principal surface of the base member, a width dimension of the sides is equal to a width dimension of the corners,
wherein the corners each include a linear portion having a same width dimension as the sides in the plan view of the principal surface of the base member, a first curve connecting a first side of the sides to the linear portion, and a second curve connecting a second side of the sides to the linear portion;
the first curve and the second curve each include a first rounded portion having a first radius and a second rounded portion concentric with the first rounded portion and having a second radius different from the first radius; and
a difference between the first radius and the second radius is equal to the width dimension of the linear portion in the plan view of the principal surface of the base member.

2. The piezoelectric resonator unit according to Claim 1, wherein the lid member and the joining member are each made of a metal material.

3. The piezoelectric resonator unit according to Claim 1, wherein the corners each include a first rounded portion having a first radius and a second rounded portion concentric with the first rounded portion and having a second radius different from the first radius; and
in the plan view of the principal surface of the base member, a difference between the first radius and the second radius is equal to the width dimension of the sides.

4. The piezoelectric resonator unit according to claim 1, wherein the base member includes respective grooves adjacent to each of the corners.

5. The piezoelectric resonator unit according to claim 1, wherein the joining member includes:
a sealing frame in the frame shape on the principal surface of the base member and disposed along an entire circumference of the lid member; and
a joining material in the frame shape on the sealing frame.

6. The piezoelectric resonator unit according to claim 5, wherein the frame shape is a rectangular shape including sides and corners; and
in the plan view of the principal surface of the base member, a width dimension of the sides is equal to a width dimension of the corners.

7. The piezoelectric resonator unit according to claim 6, wherein the corners each include a first rounded portion having a first radius and a second rounded portion concentric with the first rounded portion and having a second radius different from the first radius; and
in the plan view of the principal surface of the base member, a difference between the first radius and the second radius is equal to the width dimension of the sides.

8. The piezoelectric resonator unit according to claim 6, wherein the base member includes respective grooves adjacent to each of the corners.

9. A piezoelectric resonator unit comprising:
a piezoelectric resonator;
a lid member and a base member defining an internal space that accommodates the piezoelectric resonator; and
a joining member joining the lid member and the base member,
wherein in a plan view of a principal surface of the base member, the joining member has a frame shape with a uniform width dimension surrounding the piezoelectric resonator,
wherein the frame shape is a rectangular shape including sides and corners, and in the plan view of the principal surface of the base member, a width dimension of the sides is equal to a width dimension of the corners, and
wherein the base member includes respective anti-alloying films adjacent to each of the corners.

10. The piezoelectric resonator unit according to claim 9, wherein the corners each include a first rounded portion having a first radius and a second rounded portion concentric with the first rounded portion and having a second radius different from the first radius; and
in the plan view of the principal surface of the base member, a difference between the first radius and the second radius is equal to the width dimension of the sides.

11. The piezoelectric resonator unit according to claim 9, wherein the joining member includes:
a sealing frame in the frame shape on the principal surface of the base member and disposed along an entire circumference of the lid member; and
a joining material in the frame shape on the sealing frame.

12. The piezoelectric resonator unit according to claim 11, wherein the frame shape is a rectangular shape including sides and corners; and
in the plan view of the principal surface of the base member, a width dimension of the sides is equal to a width dimension of the corners.

13. The piezoelectric resonator unit according to claim 12, wherein the corners each include a first rounded portion having a first radius and a second rounded portion concentric with the first rounded portion and having a second radius different from the first radius; and in the plan view of the principal surface of the base member, a difference between the first radius and the second radius is equal to the width dimension of the sides.

14. The piezoelectric resonator unit according to claim 12, wherein the base member includes respective grooves adjacent to each of the corners.

15. The piezoelectric resonator unit according to claim 9, wherein the lid member and the joining member are each made of a metal material.

16. A piezoelectric resonator unit comprising:
a piezoelectric resonator;
a lid member and a base member defining an internal space that accommodates the piezoelectric resonator; and
a joining member joining the lid member and the base member,
wherein in a plan view of a principal surface of the base member, the joining member has a frame shape with a uniform width dimension surrounding the piezoelectric resonator,
wherein the joining member includes:
a sealing frame in the frame shape on the principal surface of the base member and disposed along an entire circumference of the lid member; and
a joining material in the frame shape on the sealing frame,
wherein the frame shape is a rectangular shape including sides and corners, and in the plan view of the principal surface of the base member, a width dimension of the sides is equal to a width dimension of the corners,
wherein the corners each include a linear portion having a same width dimension as the sides in the plan view of the principal surface of the base member, a first curve connecting a first side of the sides to the linear portion, and a second curve connecting a second side of the sides to the linear portion;
the first curve and the second curve each include a first rounded portion having a first radius and a second rounded portion concentric with the first rounded portion and having a second radius different from the first radius; and
a difference between the first radius and the second radius is equal to the width dimension of the linear portion in the plan view of the principal surface of the base member.

17. A piezoelectric resonator unit comprising:
a piezoelectric resonator;
a lid member and a base member defining an internal space that accommodates the piezoelectric resonator; and
a joining member joining the lid member and the base member, wherein in a plan view of a principal surface of the base member, the joining member has a frame shape with a uniform width dimension surrounding the piezoelectric resonator,
wherein the joining member includes:
a sealing frame in the frame shape on the principal surface of the base member and disposed along an entire circumference of the lid member; and
a joining material in the frame shape on the sealing frame,
wherein the frame shape is a rectangular shape including sides and corners, and in the plan view of the principal surface of the base member, a width dimension of the sides is equal to a width dimension of the corners, and
wherein the base member includes respective anti-alloying films adjacent to each of the corners.

18. The piezoelectric resonator unit according to claim 17, wherein the corners each include a first rounded portion having a first radius and a second rounded portion concentric with the first rounded portion and having a second radius different from the first radius; and in the plan view of the principal surface of the base member, a difference between the first radius and the second radius is equal to the width dimension of the sides.

19. A piezoelectric resonator unit manufacturing method, the method comprising:
preparing a base member;
holding a piezoelectric resonator on a principal surface of the base member; and
joining a lid member to the base member with a joining member,
wherein in a plan view of the principal surface of the base member, the joining member has a frame shape surrounding the piezoelectric resonator, and the frame shape has a uniform width
wherein the lid member and the joining member are each made of a metal material; and the joining of the lid member to the base member includes heating and melting the joining member,
wherein the frame shape is a rectangular shape including corners;
the corners each include a rounded portion; and
the joining of the lid member to the base member includes positioning respective anti-alloying films adjacent to each of the corners and forming the rounded portion of each corner using a corresponding one of the anti-alloying films.

20. The piezoelectric resonator unit manufacturing method according to claim 19, further comprising:
adding a sealing frame on the principal surface of the base member;
adding a joining material on the lid member sealing frame; and
joining the sealing frame and the joining material to form the joining member.

* * * * *